(12) United States Patent
Tsuchida

(10) Patent No.: US 10,880,955 B2
(45) Date of Patent: Dec. 29, 2020

(54) CERAMIC MEMBER

(71) Applicant: NGK Spark Plug Co., LTD., Nagoya (JP)

(72) Inventor: Atsushi Tsuchida, Sendai (JP)

(73) Assignee: NGK Spark Plug Co., LTD., Nagoya (JP)

(*) Notice: Subject to any disclaimer, the term of this patent is extended or adjusted under 35 U.S.C. 154(b) by 92 days.

(21) Appl. No.: 15/736,172

(22) PCT Filed: Nov. 29, 2016

(86) PCT No.: PCT/JP2016/085366
§ 371 (c)(1),
(2) Date: Dec. 13, 2017

(87) PCT Pub. No.: WO2017/115599
PCT Pub. Date: Jul. 6, 2017

(65) Prior Publication Data
US 2018/0310362 A1    Oct. 25, 2018

(30) Foreign Application Priority Data
Dec. 28, 2015   (JP) .................. 2015-256440

(51) Int. Cl.
*H05B 3/26*        (2006.01)
*H01L 21/683*      (2006.01)
(Continued)

(52) U.S. Cl.
CPC ........... *H05B 3/265* (2013.01); *C04B 37/026* (2013.01); *H01L 21/67103* (2013.01);
(Continued)

(58) Field of Classification Search
CPC .... H05B 3/265; H05B 3/283; H01L 21/68792
See application file for complete search history.

(56) References Cited

U.S. PATENT DOCUMENTS 3,274,030 A  *  9/1966  Salomon .................. H01L 21/00
                                                    136/259
6,348,273 B1 *  2/2002  Ishikawa .............. B23K 35/286
                                                    428/621
(Continued)

FOREIGN PATENT DOCUMENTS

JP      09-235166 A     9/1997
JP      2001-110877 A   4/2001
(Continued)

OTHER PUBLICATIONS

International Search Report dated Jan. 31, 2017 for the corresponding PCT Application No. PCT/JP2016/085366.
(Continued)

*Primary Examiner* — J C Jacyna
(74) *Attorney, Agent, or Firm* — Leason Ellis LLP

(57) ABSTRACT

A ceramic member includes a voltage supply rod capable of reducing a local temperature drop of the ceramic member. The ceramic member comprises a ceramic base, a metal body disposed inside the ceramic base, and a voltage supply rod made of an electrically conductive material and having a far end portion electrically connected to the metal body. The far end portion is located at an end of the voltage supply rod in a longitudinal direction. The voltage supply rod also includes a heat-transfer reducing portion continuous with the far end portion. The heat-transfer reducing portion has thermal conductivity k2 and a cross-sectional area A2 in a cross section taken perpendicularly to the longitudinal direction. The thermal conductivity k2 and the cross-sectional area A2 satisfy a formula $k_2 \cdot A_2 < k_1 \cdot A_1$, where $k_1$ denotes thermal conductivity of the base end portion, and $A_1$ denotes a cross-sectional area of the base end portion.

7 Claims, 2 Drawing Sheets

(51) Int. Cl.
*H01L 21/687* (2006.01)
*H05B 3/28* (2006.01)
*C04B 37/02* (2006.01)
*H05B 3/06* (2006.01)
*H01L 21/67* (2006.01)

(52) U.S. Cl.
CPC ...... *H01L 21/6831* (2013.01); *H01L 21/6833* (2013.01); *H01L 21/68792* (2013.01); *H05B 3/06* (2013.01); *H05B 3/283* (2013.01); *C04B 2237/122* (2013.01); *C04B 2237/125* (2013.01); *C04B 2237/366* (2013.01); *C04B 2237/403* (2013.01); *C04B 2237/84* (2013.01); *H05B 2203/013* (2013.01); *H05B 2203/016* (2013.01)

(56) References Cited

U.S. PATENT DOCUMENTS

| | | | |
|---|---|---|---|
| 6,617,514 B1 * | 9/2003 | Ushikoshi | H01L 21/6833 174/84 R |
| 7,679,034 B2 | 3/2010 | Goto et al. | |
| 2004/0187789 A1 | 9/2004 | Natsuhara et al. | |
| 2005/0253285 A1 | 11/2005 | Kuibira et al. | |
| 2006/0073349 A1 * | 4/2006 | Aihara | C04B 35/117 428/469 |
| 2006/0237442 A1 | 10/2006 | Goto et al. | |
| 2008/0060576 A1 | 3/2008 | Natsuhara et al. | |
| 2012/0250211 A1 * | 10/2012 | Kida | H01L 21/6833 361/234 |
| 2016/0358801 A1 | 12/2016 | Minami et al. | |
| 2016/0368829 A1 | 12/2016 | Minami et al. | |
| 2017/0069520 A1 * | 3/2017 | Unno | H01L 21/67103 |

FOREIGN PATENT DOCUMENTS

| | | | | |
|---|---|---|---|---|
| JP | 2001-167862 A | 6/2001 | | |
| JP | 2002-313530 A | 10/2002 | | |
| JP | 2005-317749 A | 11/2005 | | |
| JP | 2006-302887 A | 11/2006 | | |
| JP | 4111013 B | 4/2008 | | |
| JP | WO2015/198892 | * 12/2015 | ............ | H05B 3/283 |
| KR | 20160130760 A | 11/2016 | | |
| WO | WO-2015/133576 A | 9/2015 | | |
| WO | WO-2015/133577 A | 9/2015 | | |

OTHER PUBLICATIONS

Office Action dated Oct. 15, 2019 for the corresponding Japanese Patent Application No. 2015-256440.
Korean Office Action dated Sep. 9, 2019 for the corresponding Korean Patent Application No. 10-2018-7003073.

* cited by examiner

CERAMIC MEMBER

CROSS-REFERENCE TO RELATED PATENT APPLICATIONS

This application is a U.S. National Phase Application under 35 U.S.C. § 371 of International Patent Application No. PCT/JP2016/085366, filed Nov. 29, 2016, and claims the benefit of Japanese Patent Application No. 2015-256440, filed Dec. 28, 2015, all of which are incorporated herein by reference in their entireties. The International Application was published in Japanese on Jul. 6, 2017 as International Publication No. WO/2017/115599 under PCT Article 21(2).

FIELD OF THE INVENTION

The present invention relates to a ceramic member, particularly to a ceramic member including a voltage supply rod.

BACKGROUND OF THE INVENTION

A ceramic member included in, for example, a device for manufacturing semiconductors such as an electrostatic chuck and a RF susceptor needs to include a voltage supply rod for applying a voltage to, for example, a heater or an electrode embedded in the ceramic member.

Such a ceramic member has a unique arrangement of, for example, a heater or an electrode to allow a Si wafer mounted on the surface of the ceramic member to have a uniform temperature and for other purposes.

A voltage supply rod is a solid round bar made of a highly electrically conductive metal, which is fixed to the undersurface of a thin metal board forming the heater or the electrode embedded in the ceramic member, for example, by brazing or soldering.

Japanese Patent No. 4111013 describes a ceramic member (wafer holder) to which a shaft is joined. A voltage supply rod disposed in the shaft has a heat capacity of lower than or equal to 10% of the heat capacity of a portion of the ceramic member, corresponding to an outer circumferential portion of the shaft, to prevent uneven distribution of the temperature on the surface of the ceramic member resulting from heat dissipation from the voltage supply rod (electrode).

Technical Problem

However, the voltage supply rod is a solid member made of a highly electrically conductive and highly thermal conductive metal, so that the heat of the ceramic member dissipates from the voltage supply rod. Thus, a portion of the ceramic member located above the voltage supply rod has a locally low temperature, and the Si wafer mounted on the surface of the ceramic member has an unintended temperature variation.

In the ceramic member described in Japanese Patent No. 4111013, a uniform temperature gradient forms in a stationary state, and a heat flow corresponding to the thermal conductivity, the shape, and other parameters occurs regardless of the heat capacity of the entire voltage supply rod. Thus, the uneven temperature distribution on the surface of the ceramic member at a portion immediately above the voltage supply rod is not significantly reduced.

The present invention aims to provide a ceramic member including a voltage supply rod capable of reducing a local drop of the temperature of the ceramic member.

SUMMARY OF THE INVENTION

Solution to Problem

A ceramic member according to the present invention includes a ceramic base, a metal body disposed inside the ceramic base, and a voltage supply rod made of an electrically conductive material and having a far end portion that is electrically connected to the metal body and located at an end of the voltage supply rod in a longitudinal direction. The voltage supply rod includes a heat-transfer reducing portion having thermal conductivity $k_2$ and a cross-sectional area $A_2$ in a cross section taken perpendicularly to the longitudinal direction. The thermal conductivity $k_2$ and the cross-sectional area $A_2$ satisfy a formula $k_2 \cdot A_2 < k_1 \cdot A_1$ where $k_1$ denotes thermal conductivity of a base end portion, and $A_1$ denotes a cross-sectional area of the base end portion.

According to the present invention, the heat-transfer reducing portion has a smaller value of (thermal conductivity $k_2$)×(cross-sectional area $A_2$), than in the case where the voltage supply rod has a value of (thermal conductivity $k$)×(cross-sectional area $A$) throughout, which is the same as the value of (thermal conductivity $k_1$)×(cross-sectional area $A_1$) of the base end portion.

This structure reduces an amount of heat that dissipates from the ceramic base through the voltage supply rod, so that a temperature drop of the ceramic base at a local portion above the voltage supply rod can be reduced. This structure can thus reduce a local temperature drop of, for example, a Si wafer mounted on the ceramic base.

In the present invention, preferably, the heat-transfer reducing portion is located at the far end portion of the voltage supply rod.

In this case, the heat-transfer reducing portion is located at the far end of the voltage supply rod and connected to the metal body. This structure further reduces an amount of heat that dissipates from the ceramic base through the voltage supply rod, so that a temperature drop of the ceramic base at a local portion above the voltage supply rod can be further reduced.

In the present invention, preferably, the heat-transfer reducing portion has an unventilated hollow portion.

In this case, air in the hollow portion is not allowed to flow to the outside. Heat can thus be prevented from dissipating to the outside using the air. This structure can thus further reduce a local temperature drop of, for example, a Si wafer mounted on the ceramic base.

The atmospheric pressure in the hollow portion closer to zero atmospheric pressure is more preferable. In this case, the vacuum insulation can further prevent a local temperature drop of, for example, a Si wafer mounted on the ceramic base.

Compared to the one having a solid structure, the voltage supply rod having a hollow portion has lower electrical conductivity.

Thus, in the present invention, when the heat-transfer reducing portion has a hollow portion, preferably, containing a member and a surrounding member. The thermal conductivity of the member is lower than the thermal conductivity of the surrounding member.

In this structure, the member disposed in the hollow portion can prevent heat from dissipating and enhance the electrical conductivity.

BRIEF DESCRIPTION OF THE DRAWINGS

These and other features and advantages of the present invention will become more readily appreciated when considered in connection with the following detailed description and appended drawing(s), wherein like designations denote like elements in the various views, and wherein.

DETAILED DESCRIPTION OF THE INVENTION

A ceramic member 100 according to an embodiment of the present invention is described.

Figure 1:
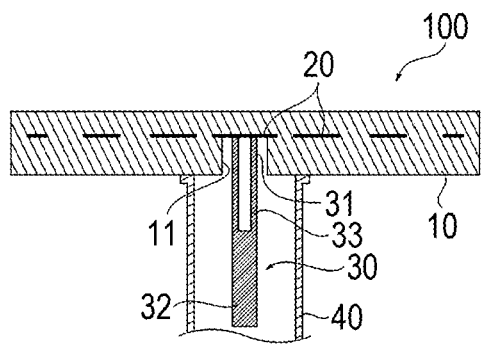
FIG. 1 is a sectional view of a ceramic member according to an embodiment of the present invention.

As illustrated in FIG. 1, the ceramic member 100 includes a ceramic base 10, a metal body 20, a voltage supply rod 30, and a shaft 40. The ceramic member 100 is an electrostatic chuck that sucks a substrate to the surface of the base 10 using the Coulomb force resulting from a voltage applied from the voltage supply rod 30 to the metal body 20, which serves as an electrode.

The ceramic member 100 may alternatively be a heater in which the metal body 20 serves as a heat element (heater), which heats a substrate A mounted on the surface of the ceramic base 10 with heat generated as a result of the voltage supply rod 30 applying a voltage to the heater.

Alternatively, the ceramic member 100 may be an electrostatic chuck with a heater function, in which a metal body 20 located closer to the surface functions as an electrode and a metal body 20 located farther from the surface functions as a heat element. Here, voltage supply rods 30 connected to both metal bodies 20 may each include a heat-transfer reducing portion 33, described below, or only the voltage supply rod 30 connected to the metal body 20 located closer to the surface may include a heat-transfer reducing portion 33.

In the ceramic member 100, the metal body 20 is embedded in the ceramic base 10 and a far end portion 31 of the voltage supply rod 30, at the far end in the longitudinal direction, is connected to the back surface of the metal body 20. A base end portion 32 of the voltage supply rod 30, at the base end in the longitudinal direction, protrudes from the back surface of the ceramic base 10. The base end portion 32 of the voltage supply rod 30, at the base end in the longitudinal direction, is connected to an external power source, not illustrated.

The surface of the ceramic base 10 may be covered with, for example, a protection layer. A cooling mechanism may be disposed in the ceramic base 10.

The ceramic base 10 is made of, for example, a sintered ceramic body of alumina ($Al_2O_3$), aluminum nitride (AlN), or yttria ($Y_2O_3$). The ceramic base 10 may be made of any material usable as a material of the base of an electrostatic chuck or a heater.

The ceramic base 10 is a sintered ceramic body formed by, for example, performing hot-press sintering on a compact of a powdery material mixture containing powdery aluminum nitride of high purity (for example, purity of higher than or equal to 99.9%) and, as needed, a sintering agent such as an appropriate amount of powdery yttrium oxide.

Then, the metal body 20, made of a metal mesh or metal foil, is inserted in the sintered ceramic body and hot-pressed to be embedded in the ceramic base 10. The way of embedding the metal body 20 is not limited to this. For example, powdery metal serving as a material of the metal body 20 may be enclosed in the material mixture and the resultant may be hot-pressed as a whole. Instead, a recess may be formed in the boundary surface of sintered ceramic bodies to receive the metal body 20 therein and the sintered ceramic bodies may be joined together using a binder.

The metal body 20 is made of a metal such as tungsten, molybdenum, an alloy of these, platinum, or titanium in the form of, for example, a thin plate, a thin film, a mesh, or a line.

A cylindrical hole 11 is formed by grinding in the back surface of the ceramic base 10 to extend to the back surface of the metal body 20.

The voltage supply rod 30 is made of a metal having high heat resistance, high acid resistance, and high electrical conductivity, such as titanium (Ti) or nickel (Ni). The far end portion 31 of the voltage supply rod 30, at the far end in the longitudinal direction, is fixed to the metal body 20 while having its far end surface in contact with the back surface of the metal body 20, and the voltage supply rod 30 and the metal body 20 are electrically connected to each other for power supply and mechanically connected around the far end surface of the voltage supply rod 30.

The shaft 40 having, for example, a hollow cylindrical shape is fixed to the back surface of the ceramic base 10 by, for example, brazing or soldering so as to surround the entirety of the outer side of the voltage supply rod 30 or, if provided, multiple voltage supply rods 30.

The voltage supply rod 30 includes a heat-transfer reducing portion 33 at a portion in the longitudinal direction. In the cross section taken perpendicularly to the longitudinal direction, the heat-transfer reducing portion 33 has a value of (thermal conductivity k2)×(cross-sectional area A2), which is smaller than the value of (thermal conductivity k1)×(cross-sectional area A1) of the base end portion 32.

Here, the voltage supply rod 30 has a thin cylindrical contour as a whole. The voltage supply rod 30 is made of the same material throughout and thus has a uniform thermal conductivity k throughout. Here, the voltage supply rod 30 has, as a heat-transfer reducing portion 33, a portion having a cross-sectional area A2, smaller than a cross-sectional area A1 of the base end portion 32, at the far end portion 31.

Figure 2:
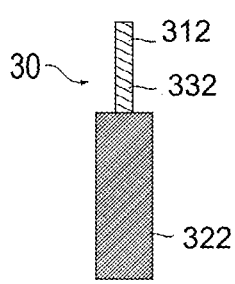
FIG. 2 is a sectional view of a heat-transfer reducing portion of a ceramic member according to another embodiment of the present invention.

For example, the heat-transfer reducing portion 33 has a hollow cylindrical shape. The cross-sectional area A2 of the heat-transfer reducing portion 33 is smaller than the cross-sectional area A1 of the base end portion 32 by the cross-sectional area of the hollow portion. As illustrated in FIG. 2, the heat-transfer reducing portion 332, which is located at the far end portion 312, may have a circular cross section having a diameter smaller than that of the base end portion 322.

The heat-transfer reducing portion 33 having a hollow cylindrical shape may be formed by processing part of a solid cylindrical member, serving as a voltage supply rod 30 as a whole. The heat-transfer reducing portion 33 having a hollow cylindrical shape may be a hollow cylindrical member fixed, by brazing or soldering or the like, to a solid member forming another portion of the voltage supply rod 30. Examples of a filler material include noble metal solder, such as silver solder, gold solder, and nickel solder. When the heat-transfer reducing portion 33 is to be joined to the ceramic member, an active metal such as titanium or zirconium (Zr) may be added to the filler material.

When the heat-transfer reducing portion 33 is positioned at the far end portion of the voltage supply rod 30, particularly, the cross-sectional area A2 needs to reliably correspond to the characteristics required to supply power to the metal body 20. For example, when the metal body 20 is used as a heater, the cross-sectional area A2 needs to correspond to the current carrying capacity required to supply power to the heater.

The heat-transfer reducing portion 33 may have any shape as long as it has a cross-sectional area A2, smaller than the cross-sectional area A1 of the base end portion 32. For example, the cross sections of the far end portion 31, the base end portion 32, and the heat-transfer reducing portion 33 of the voltage supply rod 30 may have an oval shape, a polygonal shape such as triangular or quadrangular shape, or a shape having recesses such as a star shape (not shown).

Figure 3A:
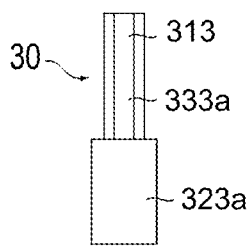
FIG. 3A is a front view of a heat-transfer reducing portion of a ceramic member according to another embodiment of the present invention.
Figure 3B:
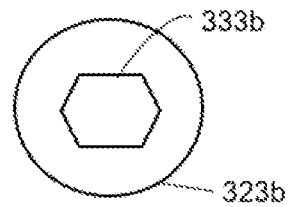
FIG. 3B is a plan view of a heat-transfer reducing portion of a ceramic member according to another embodiment of the present invention.
Figure 4:
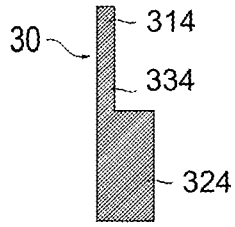
FIG. 4 is a sectional view of a heat-transfer reducing portion of a ceramic member according to another embodiment of the present invention.

The heat-transfer reducing portion 33 is not limited to the one having a cross section similar to the base end portion 32 or having a hollow in the cross section of the base end portion 322. For example, as illustrated in FIG. 3A, the cross sections of the base end portion 323a and the heat-transfer reducing portion 333a, which is located at the far end portion 313, may not be similar to each other, as in the case, for example, as shown in FIG. 3B, where the base end portion 323b has a circular cross section and the heat-transfer reducing portion 333b has a hexagonal cross section. Instead, as illustrated in FIG. 4, the heat-transfer reducing portion 334, which is located at the far end portion 314, may have a cut, a recess, one or more holes communicating to the side surface, or a slit.

Multiple heat-transfer reducing portions may be provided. These heat-transfer reducing portions may have cross-sectional areas A2 different from each other.

Figure 5:
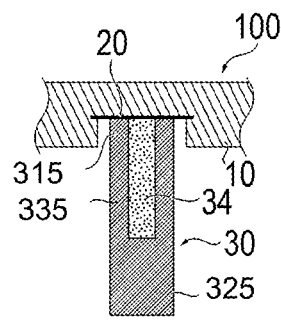
FIG. 5 is a sectional view of a heat-transfer reducing portion of a ceramic member according to another embodiment of the present invention.

The heat-transfer reducing portion 335, which is located at the far end portion 315, may have the cross-sectional area A2 the same as the cross-sectional area A1 of the base end portion 325. In this case, the heat-transfer reducing portion 335 may be made of a material having thermal conductivity k2, which is smaller than the thermal conductivity k1 of the base end portion 325. For example, as illustrated in FIG. 5, the heat-transfer reducing portion 335 may be formed by embedding a heat insulating member 34 made of, for example, alumina, silica ($SiO_2$), or magnesia (MgO), in the hollow portion. In this case, for example, the voltage supply rod 30 may be divided into upper and lower halves, the heat insulating member 34 may be embedded in the recessed portions of these, and then they may be joined together by, for example, screwing or bonding.

Figure 6:
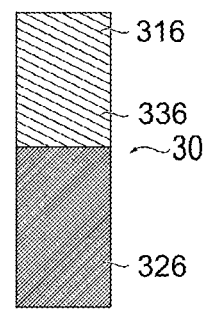
FIG. 6 is a sectional view of a heat-transfer reducing portion of a ceramic member according to another embodiment of the present invention.

As illustrated in FIG. 6, the heat-transfer reducing portion 336 made of a material having thermal conductivity k2 smaller than the thermal conductivity k1 of the base end portion 326 may be fixed to the far end portion of the voltage supply rod 30 by, for example, brazing, soldering, welding, or bonding. In this case, the voltage supply rod 30 preferably has high electrical conductivity. Thus, the heat-transfer reducing portion 336, which is located at the far end portion 316, needs to contain a material such as titanium or nickel as a main component.

Naturally, the thermal conductivity k2 of the heat-transfer reducing portion 33 may be smaller than the thermal conductivity k1 of the base end portion 32, and the cross-sectional area A2 of the heat-transfer reducing portion 33 may be smaller than the cross-sectional area A1 of the base end portion 32.

Since the heat-transfer reducing portion 33, 332, 333, 334, 335, 336 has the above structure, as described in Japanese Patent No. 4111013, the heat-transfer reducing portion 33, 332, 333, 334, 335, 336 has a smaller value of (thermal conductivity k2)×(cross-sectional area A2), compared to the case where the voltage supply rod 30 has a value of (thermal conductivity k)×(cross-sectional area A) throughout, which is the same as the value of (thermal conductivity k1)×(cross-sectional area A1) of the base end portion 32, 322, 323, 324, 325, 326.

This structure reduces an amount of heat that dissipates from the ceramic base 10 through the voltage supply rod 30, so that a temperature drop of the ceramic base 10 at a local portion above the voltage supply rod 30 can be reduced. This structure can thus reduce a local temperature drop of, for example, a Si wafer mounted on the ceramic member 100.

As illustrated in FIG. 1, when the heat-transfer reducing portion 33 has an unventilated hollow portion, air in the hollow portion is not allowed to flow to the outside. Heat can thus be prevented from dissipating to the outside using the air. This structure can thus further reduce a local temperature drop of, for example, a Si wafer mounted on the ceramic member 100.

The atmospheric pressure in the hollow portion closer to zero atmospheric pressure is more preferable. In this case, the vacuum insulation can further prevent a local temperature drop of, for example, a Si wafer mounted on the ceramic member 100. The hollow structure can be manufactured by brazing or soldering two metal members together under reduced pressure in a typical vacuum furnace.

A heater current needs to be increased to raise the temperature. Compared to the one having a solid structure, the voltage supply rod 30 having a hollow portion has lower electrical conductivity. Thus, when the heat-transfer reducing portion 335 has a hollow portion, as illustrated in FIG. 5, preferably, the heat insulating member 34 made of a material having thermal conductivity lower than the thermal conductivity k of the material of the surrounding portion is disposed in the hollow portion. In this case, when including the heat insulating member 34 disposed in the hollow portion and made of a material having high electrical conductivity, the voltage supply rod 30 can prevent heat dissipation and have higher electrical conductivity.

Thus far, a case where the far end portion 31 of the voltage supply rod 30 is directly connected to the metal body 20 is described, but this is not the only possible structure. For example, a terminal may be connected to the metal body 20, and the far end portion 31 of the voltage supply rod 30 may be connected to this terminal. In this case, the terminal and the far end portion 31 of the voltage supply rod 30 may be joined by, for example, screwing. The way of joining them are not limitative and include, for example, screwing and bonding with an adhesive.

Thus far, a case where the heat-transfer reducing portion 33 is disposed at the far end portion 31 of the voltage supply rod 30 is described, but this is not the only possible structure. For example, the heat-transfer reducing portion 33 may be disposed between the far end portion 31 and the base end portion 32 of the voltage supply rod 30. Multiple heat-transfer reducing portions 33 may be provided.

EXAMPLES

Reference Example 1

As a material of the ceramic base 10, a powdery material mixture was prepared by adding 3 weight percent of powdery yttrium oxide to powdery aluminium nitride. As an example of the metal body 20, a plain woven mesh with a mesh size (the number of wires per inch) of #50 and composed of wires made of molybdenum and having a wire diameter of 0.1 mm was prepared.

The metal body 20 was embedded in the material mixture, and formed into a compact. The compact was subjected to hot-press sintering to form a ceramic base 10, formed of a disk-shaped sintered ceramic body having a diameter of 296 mm and a thickness of 20 mm.

As an example of the shaft 40, a sintered aluminium nitride body having a hollow cylindrical shape with an outer diameter of 50 mm, an inner diameter of 42 mm, and a length of 300 mm was prepared. The shaft 40 included a flange portion at the junction between itself and the ceramic base 10. The flange portion had an outer diameter of 70 mm, an inner diameter $\phi$ of 42 mm, and a flange thickness of 10 mm.

As an example of the voltage supply rod, a member made of nickel and having a solid cylindrical shape with an outer diameter of 6.0 mm and a length of 350 mm was prepared.

The far end surface of the voltage supply rod was brazed or soldered to the back surface of the metal body 20 using a filler material containing gold, copper, and titanium. Thus, the ceramic member was completed.

Nickel has a thermal conductivity k of 88 W/mK. Thus, the voltage supply rod has a value of (thermal conductivity k)×(cross-sectional area A) of $2.5 \times 10^{-3}$ Wm/K.

Power was fed from the voltage supply rod to the ceramic member disposed in the vacuum chamber so that the surface of the ceramic base 10 has a temperature of 500° C.

The distribution of the temperature of the heater surface was measured using an infrared camera disposed above the upper surface of the ceramic base 10 with an infrared-transparent viewport interposed therebetween. A cool spot was observed on the surface of the ceramic base 10 immediately above the voltage supply rod in an area having a lower temperature than the surrounding area. The temperature at the cool spot was lower by 3.0° C. than the surface temperature of the surrounding area.

Reference Example 2

Except for changing the material of the voltage supply rod to titanium, a ceramic member was manufactured in the same manner as in the case of Reference Example 1.

Titanium has a thermal conductivity k of 16 W/mK. Thus, the voltage supply rod has a value of (thermal conductivity k)×(cross-sectional area A) of $4.5 \times 10^{-4}$ Wm/K.

When the surface of the ceramic base 10 was measured in the same manner as in the case of Reference Example 1, a cool spot was observed on the surface of the ceramic base 10. The temperature at the cool spot was lower by 1.7° C. than the surface temperature of the surrounding area.

Example 1

As an example of the voltage supply rod 30, a solid cylindrical member made of nickel and having an outer diameter of 6.0 mm and a length of 300 mm and a hollow cylindrical member made of nickel and having an outer diameter of 6.0 mm, a thickness of 0.4 mm, and a length of 50 mm were fixed to each other by brazing or soldering using a filler material containing gold, copper, and titanium so as to have the outer circumferential surfaces flush with each other.

In this voltage supply rod 30, a portion formed of the solid cylindrical member constituted a portion including the base end portion 32 and excluding the heat-transfer reducing portion 33, and a portion formed of the hollow cylindrical member constituted the heat-transfer reducing portion 33 and the far end portion 31.

The far end surface of the far end portion 31 of the voltage supply rod 30 was brazed or soldered to the back surface of the metal body 20 with a filler material containing gold, copper, and titanium. Thus, the ceramic member 100 was completed.

Nickel has a thermal conductivity k of 88 W/mK. Thus, the base end portion 32 and other portions have a value of (thermal conductivity k1)×(cross-sectional area A1) of $2.5 \times 10^{-3}$ Wm/K, and the heat-transfer reducing portion 33 has a value of (thermal conductivity k2)×(cross-sectional area A2) of $6.2 \times 10^{-4}$ Wm/K.

When the surface of the ceramic base 10 was measured in the same manner as in the case of Reference Example 1, a cool spot was observed on the surface of the ceramic base 10. The temperature at the cool spot was lower by only 1.5° C. than the surface temperature of the surrounding area. Compared to Reference Example 1, the cool spot due to the voltage supply rod 30 was found to be reduced.

Example 2

Except for changing the material of the voltage supply rod 30 to titanium, a ceramic member was manufactured in the same manner as in the case of Example 1.

Titanium has a thermal conductivity k of 16 W/mK. Thus, the base end portion 32 and other portions have a value of (thermal conductivity k1)×(cross-sectional area A1) of $4.5 \times 10^{-4}$ Wm/K, and the heat-transfer reducing portion 33 has a value of (thermal conductivity k2)×(cross-sectional area A2) of $1.1 \times 10^{-4}$ Wm/K.

When the surface of the ceramic base 10 was measured in the same manner as in the case of Reference Example 1, a cool spot was observed on the surface of the ceramic base 10. The temperature at the cool spot was lower by only 0.5° C. than the surface temperature of the surrounding area. Compared to Reference Example 2, the cool spot due to the voltage supply rod 30 was found to be reduced.

Example 3

As an example of the voltage supply rod 30, a solid cylindrical member made of nickel and having an outer diameter of 6.0 mm and a length of 300 mm and a hollow cylindrical member made of nickel and having an outer diameter of 1.5 mm and a length of 50 mm were fixed to each other by brazing or soldering using a filler material containing gold, copper, and titanium so as to be coaxial with each other.

In this voltage supply rod 30, a portion formed of a thick solid cylindrical member constituted a portion including the base end portion 32 and excluding the heat-transfer reducing portion 33, and a portion formed of a thin solid cylindrical member constituted the heat-transfer reducing portion 33 and the far end portion 31.

The far end surface of the far end portion 31 of the voltage supply rod 30 was brazed or soldered to the back surface of the metal body 20 with a filler material containing gold, copper, and titanium.

Nickel has a thermal conductivity k of 88 W/mK. Thus, the base end portion 32 and other portions have a value of (thermal conductivity k1)×(cross-sectional area A1) of $2.5 \times 10^{-3}$ Wm/K, and the heat-transfer reducing portion 33 has a value of (thermal conductivity k2)×(cross-sectional area A2) of $1.6 \times 10^{-4}$ Wm/K.

When the surface of the ceramic base 10 was measured in the same manner as in the case of Reference Example 1, a cool spot was observed on the surface of the ceramic base 10. The temperature at the cool spot was lower by only 0.8° C. than the surface temperature of the surrounding area. Compared to Reference Example 1, the cool spot due to the voltage supply rod 30 was found to be reduced.

Example 4

Except for changing the material of the voltage supply rod 30 to titanium, a ceramic member was manufactured in the same manner as in the case of Example 3.

Titanium has a thermal conductivity k of 16 W/mK. Thus, the base end portion 32 and other portions have a value of (thermal conductivity k1)×(cross-sectional area A1) of $4.5 \times 10^{-4}$ Wm/K, and the heat-transfer reducing portion 33 has a value of (thermal conductivity k2)×(cross-sectional area A2) of $2.8 \times 10^{-5}$ Wm/K.

When the surface of the ceramic base 10 was measured in the same manner as in the case of Reference Example 1, a cool spot was observed on the surface of the ceramic base 10. The temperature at the cool spot was lower by only 0.4° C. than the surface temperature of the surrounding area. Compared to Reference Example 2, the cool spot due to the voltage supply rod 30 was found to be reduced.

Example 5

As an example of the voltage supply rod 30, a solid cylindrical member made of nickel and having an outer diameter of 6.0 mm and a length of 300 mm and an equilateral rectangular prism member made of nickel and having each side of 1.5 mm and a length of 50 mm were fixed to each other by brazing or soldering using a filler material containing gold, copper, and titanium so as to be coaxial with each other.

In this voltage supply rod 30, a portion formed of the thick solid cylindrical member constituted a portion including the base end portion 32 and excluding the heat-transfer reducing portion 33, and a portion formed of the equilateral rectangular prism member constituted the heat-transfer reducing portion 33 and the far end portion 31.

The far end surface of the far end portion 31 of the voltage supply rod 30 was brazed or soldered to the back surface of the metal body 20 with a filler material containing gold, copper, and titanium.

Nickel has a thermal conductivity k of 88 W/mK. Thus, the base end portion 32 and other portions have a value of (thermal conductivity k1)×(cross-sectional area A1) of $2.5 \times 10^{-3}$ Wm/K, and the heat-transfer reducing portion 33 has a value of (thermal conductivity k2)×(cross-sectional area A2) of $2.0 \times 10^{-4}$ Wm/K.

When the surface of the ceramic base 10 was measured in the same manner as in the case of Reference Example 1, a cool spot was observed on the surface of the ceramic base 10. The temperature at the cool spot was lower by only 1.2° C. than the surface temperature of the surrounding area. Compared to Reference Example 1, the cool spot due to the voltage supply rod 30 was found to be reduced.

Example 6

Except for changing the material of the voltage supply rod 30 to titanium, a ceramic member was manufactured in the same manner as in the case of Example 5.

Titanium has a thermal conductivity k of 16 W/mK. Thus, the base end portion 32 and other portions have a value of (thermal conductivity k1)×(cross-sectional area A1) of $4.5 \times 10^{-4}$ Wm/K, and the heat-transfer reducing portion 33 has a value of (thermal conductivity k2)×(cross-sectional area A2) of $3.6 \times 10^{-5}$ Wm/K.

When the surface of the ceramic base 10 was measured in the same manner as in the case of Reference Example 1, a cool spot was observed on the surface of the ceramic base 10. The temperature at the cool spot was lower by only 0.4° C. than the surface temperature of the surrounding area. Compared to Reference Example 2, the cool spot due to the voltage supply rod 30 was found to be reduced.

Table 1 collectively shows the results of Examples 1 to 6.

TABLE 1

| | | Example 1 | Example 2 | Example 3 | Example 4 | Example 5 | Example 6 |
|---|---|---|---|---|---|---|---|
| Base end portion | Material | Ni | Ti | Ni | Ti | Ni | Ti |
| | Diameter (mm) | 6.0 | 6.0 | 6.0 | 6.0 | 6.0 | 6.0 |
| | Length (mm) | 300 | 300 | 300 | 300 | 300 | 300 |
| | K1 × A1 (Wm/K) | $2.5 \times 10^{-3}$ | $4.5 \times 10^{-4}$ | $2.5 \times 10^{-3}$ | $4.5 \times 10^{-4}$ | $2.5 \times 10^{-3}$ | $4.5 \times 10^{-4}$ |
| Heat-transfer reducing portion | Shape | Hollow cylinder | Hollow cylinder | Thin solid cylinder | Thin solid cylinder | Equilateral rectangular prism | Equilateral rectangular prism |
| | Material | Ni | Ti | Ni | Ti | Ni | Ti |
| | Diameter (mm) | 6.0 | 6.0 | 1.5 | 1.5 | — | — |
| | Length (mm) | 50 | 50 | 50 | 50 | 50 | 50 |
| | Thickness (mm) | 0.4 | 0.4 | — | — | — | — |
| | Each side (mm) | — | — | — | — | 1.5 | 1.5 |
| | K2 × A2 (Wm/K) | $6.2 \times 10^{-4}$ | $1.1 \times 10^{-4}$ | $1.6 \times 10^{-4}$ | $2.8 \times 10^{-5}$ | $2.0 \times 10^{-4}$ | $3.6 \times 10^{-5}$ |
| Cool spot temperature drop (° C.) | | 1.5 | 0.5 | 0.8 | 0.4 | 1.2 | 0.4 |

REFERENCE SIGNS LIST 10 ceramic base
11 hole
20 metal body
30 voltage supply rod
31 far end portion 32 base end portion
33 heat-transfer reducing portion
34 heat insulating member
40 shaft
100 ceramic member

The invention claimed is:

1. A ceramic member, comprising:
a ceramic base;
a metal body disposed inside the ceramic base; and
a voltage supply rod made of an electrically conductive material and having a far end portion electrically connected to the metal body, said far end portion being located at an end of the voltage supply rod in a longitudinal direction, wherein
the voltage supply rod includes a heat-transfer reducing portion and a base end portion from which the heat-transfer reducing portion protrudes, said heat-transfer reducing portion having thermal conductivity k2 and a cross-sectional area A2 in a cross section taken perpendicularly to the longitudinal direction,
the thermal conductivity k2 and the cross-sectional area A2 satisfy a formula k2·A2<k1·A1, where k1 denotes thermal conductivity of the base end portion, and A1 denotes a cross-sectional area of the base end portion,
the heat-transfer reducing portion is located at least partly within the ceramic base and the base end portion extends in the longitudinal direction entirely outside the ceramic base, and
the heat-transfer reducing portion has an unventilated hollow portion.

2. The ceramic member according to claim 1, wherein the heat-transfer reducing portion is located at the far end portion of the voltage supply rod.

3. The ceramic member according to claim 1, wherein
the heat-transfer reducing portion has the unventilated hollow portion containing a member and a surrounding member, and
thermal conductivity of the member is lower than thermal conductivity of the surrounding member.

4. The ceramic member according to claim 2, wherein
the heat-transfer reducing portion has the unventilated hollow portion containing a member and a surrounding member, and
thermal conductivity of the member is lower than thermal conductivity of the surrounding member.

5. The ceramic member according to claim 1, wherein the far end portion is directly connected to the metal body.

6. The ceramic member according to claim 1, wherein the heat-transfer reducing portion is directly connected to the metal body.

7. The ceramic member according to claim 1, wherein the heat-transfer reducing portion contacts the metal base inside the ceramic base.

* * * * *